United States Patent
Chen et al.

(10) Patent No.: US 12,003,178 B2
(45) Date of Patent: Jun. 4, 2024

(54) ADAPTIVE MINIMUM DUTY CYCLE DESIGN TO EXTEND OPERATIONAL VOLTAGE RANGE FOR DCDC CONVERTERS

(71) Applicant: Diodes Incorporated, Plano, TX (US)

(72) Inventors: Wenliang Chen, Plano, TX (US); Jiansong Chen, Plano, TX (US)

(73) Assignee: DIODES INCORPORATED, Plano, TX (US)

( * ) Notice: Subject to any disclaimer, the term of this patent is extended or adjusted under 35 U.S.C. 154(b) by 14 days.

(21) Appl. No.: 17/525,592

(22) Filed: Nov. 12, 2021

(65) Prior Publication Data
US 2023/0155505 A1 May 18, 2023

(51) Int. Cl.
H02M 3/158 (2006.01)
H02M 3/07 (2006.01)
H03K 3/017 (2006.01)

(52) U.S. Cl.
CPC ........... H02M 3/1582 (2013.01); H02M 3/07 (2013.01); H03K 3/017 (2013.01)

(58) Field of Classification Search
CPC .... H02M 3/1582; H02M 3/07; H02M 1/0003; H02M 3/156
See application file for complete search history.

(56) References Cited

U.S. PATENT DOCUMENTS

| | | | |
|---|---|---|---|
| 7,961,022 B2 | 6/2011 | Zhang et al. | |
| 8,120,402 B2 | 2/2012 | Zhang et al. | |
| 8,310,221 B2 | 11/2012 | Herzer et al. | |
| 9,467,051 B2 | 10/2016 | Stoichita et al. | |
| 10,164,535 B2 | 12/2018 | Xi et al. | |
| 10,666,142 B2 | 5/2020 | Vanin et al. | |
| 2011/0062932 A1 | 3/2011 | Hawkes | |
| 2012/0182003 A1* | 7/2012 | Flaibani | H02M 3/156 323/284 |
| 2014/0239935 A1 | 8/2014 | Nene | |
| 2016/0373009 A1* | 12/2016 | Tateishi | H02M 3/156 |
| 2018/0337601 A1 | 11/2018 | Vadnerkar | |
| 2019/0238054 A1 | 8/2019 | Flaibani | |

OTHER PUBLICATIONS

Application 22200978.9, European Search Report and Written Opinion, Mar. 15, 2023, 9 Pages.

* cited by examiner

*Primary Examiner* — Jue Zhang
*Assistant Examiner* — Afework S Demisse
(74) *Attorney, Agent, or Firm* — Kilpatrick Townsend & Stockton LLP

(57) ABSTRACT

A method for a switched mode power supply (SMPS) includes providing an error voltage signal based on a difference between a sampled output voltage of the SMPS and a target voltage, and generating a clock signal characterized by an oscillating frequency; generating a switching control signal based on the error voltage signal and the clock signal using pulse-width modulation (PWM). The method further includes varying the oscillating frequency of the clock signal according to the error voltage signal in a current generating circuit, and applying the switching control signal to control the power switches of the SMPS.

17 Claims, 8 Drawing Sheets

ADAPTIVE MINIMUM DUTY CYCLE DESIGN TO EXTEND OPERATIONAL VOLTAGE RANGE FOR DCDC CONVERTERS

BACKGROUND

Switched-mode power supplies (SMPS), such as DCDC converters, are widely used in personal, automotive, and industrial electronics as DCDC power supplies, LED drivers, battery chargers and many other applications. In order to support the wide range of applications, the DCDC converters are required to cover a wide-range of input voltage (VIN) and output voltage (VOUT). It saves costs and time to market that the DCDC converters have the capability to handle a wide range of VIN and VOUT voltages without the need of multiple designs to cover only certain portions of the required operational voltage range.

In switched-mode power supplies, the minimum duty cycle (D_min) or minimum on-time (Ton_min) is confined by logic delays and charging/discharging times associated with its output FETs, including propagation delays of controller logic, blanking time of a high-side sensing amplifier, required dead-times to avoid shoot-through current, and the driver's rise and fall times, etc. All these required delay times are needed to guarantee stable operation of the converters. If these timing requirements are not met, the converters can be susceptible to malfunction, instability, and, in the worst case, non-recoverable damages. Therefore, the physical requirements on D_min impose the limitations on VIN (or VOUT) operational range of switched-mode power supplies.

The inventors have observed that these conventional solutions have many drawbacks. For example, some conventional designs reduce the minimum duty cycle (D_min) or minimum on-time (Ton_min) of buck converters by, for example, a) using process technology with lower supply voltages for shorter logic delays, b) using new topology for the high-side sensing amplifier with shorter blanking time, c) increasing the driver's strength for faster rise and fall times, or d) using complicated circuits similar to constant-on-time (COT) converters to address the issue, requiring valley and peak current detection and many more circuits. All these solutions have increased costs, increased compromises of converter's performance, or lead to the addition of complicated circuits. For example, costs can be increased due to the requirements of extra mask layers and process steps for faster digital logic with a lower supply voltage. Increasing the drivers' strength can cause worse electro-magnetic-emission (EMI) issues to prevent applications in certain systems. Thus, the trade-offs among operational voltage range, costs, and performance are compromised in the conventional solutions.

Another conventional design reduces the duty cycle of a buck converter using a clock that lowers its oscillating frequency by a current that varies directly with the input voltage for the buck converter to operate at higher input voltages. However, its open-loop design considers mainly the variation of the input voltage. In embodiments of the invention, both the variation of the input and output voltages are taken into account along with an error voltage signal in a close-loop feedback system to provide accurate control for wider applications.

Therefore, an improved solution to the minimum on-time limitation in a converter is highly desirable.

BRIEF SUMMARY

Embodiments of the invention provide a cost effective solution to extend the minimum duty-cycle for power converters to increase operational voltage range. A closed-loop adaptive minimum duty-cycle circuit uses an error voltage derived from the output to vary the switching frequency of the converter to extend the minimum duty-cycle under the system minimum on-time requirement. This design extends the operation input voltage range and provides stable waveforms in output voltage, switch node and inductor current without pulse skipping or sub-harmonic oscillation. The adaptive solution can also be applied to all types of DCDC converters, not just limited to buck converters, for example, the controllers of boost and buck-boost converters, etc.

As an example, an embodiment of this invention shows a switched mode power supply (SMPS) that includes an input node for coupling to an input voltage, an output node for providing an output voltage, a first switch coupled between the input node and a switching node, a second switch coupled between the switching node and ground node, and an inductor coupled between the switching node and the output node for providing an inductor current to the output node under control of the switches in response to a switching control signal. The SMPS also includes an error amplifier configured to compare a sampled output voltage with a first reference voltage to provide an error voltage signal, an oscillator circuit for providing a clock signal; an adaptive minimum duty-cycle circuit configured to receive the error voltage signal and to generate a current signal to vary an oscillating frequency of the clock signal in response to the error voltage signal, and a pulse-width modulation (PWM) circuit configured to receive the error voltage signal and the clock signal and to provide the switching control signal to control the switches.

In another example, an embodiment of this invention describes a controller for a switched mode power supply (SMPS) that includes an error amplifier configured to compare a sampled output voltage of the SMPS with a first reference voltage to generate an error voltage signal and oscillator circuit configured to provide a clock signal. The SMPS also has an adaptive minimum duty cycle circuit configured to receive the error voltage signal and to generate a current signal to vary an oscillating frequency of the clock signal in response to the error voltage signal. The SMPS also includes a PWM switching control circuit configured to receive the error voltage signal and the clock signal and to provide a PWM switching control signal for controlling the power switches of the SMPS.

In another example, yet another embodiment of this invention demonstrates a method for a switched mode power supply (SMPS) that includes providing an error voltage signal based on a difference between a sampled output voltage of the SMPS and a target voltage, generating a clock signal characterized by an oscillating frequency, and generating a switching control signal based on the error voltage signal and the clock signal using pulse-width modulation (PWM). The method also includes varying the oscillating frequency of the clock signal according to the error voltage signal, and applying the switching control signal to control the power switches of the SMPS.

DEFINITIONS

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A half-bridge circuit as used herein refers to a switching circuit having a high-side transistor and a low-side transistor vertically stacked and connected at a midpoint.

A power switch as used herein refers to a semiconductor switch, for example, a transistor, that is designed to handle high power levels.

A power MOSFET is a specific type of metal oxide semiconductor field-effect transistor (MOSFET) designed to handle significant power levels. An example of a power MOSFET for switching operations is called laterally-diffused MOS or simply LDMOS.

A power converter is an electrical or electro-mechanical device for converting electrical energy, such as converting between AC and DC or changing the voltage, current, or frequency, or some combinations of these conversions. A power converter often includes voltage regulation.

A switching regulator, or switch mode power supply (SMPS) uses an active device that switches on and off to maintain an average value of output. In contrast, a linear regulator is made to act like a variable resistor, continuously adjusting a voltage divider network to maintain a constant output voltage, and continually dissipating power.

A duty-cycle as used herein is the fraction of one period in which a signal or system is active.

Pulse-width modulation (PWM) as used herein is a control mechanism which uses a rectangular pulse wave whose pulse width or duty cycle is modulated resulting in the variation of the average value of the waveform.

A DCDC or DC-to-DC converter as used herein is an electronic circuit that converts a source of direct current (DC) from one voltage level to another.

A buck converter as used herein is a DC-to-DC power converter which steps down voltage (while drawing less average current) from its input (supply).

A boost converter as used herein is a DC-to-DC power converter that steps up voltage (while stepping down current) from its input (supply) to its output.

A buck-boost converter as used herein is a type of DC-to-DC converter that has an output voltage magnitude that is either greater than or less than the input voltage.

An error amplifier as used herein is an electronic circuit that amplifies an error signal based on the difference between a reference signal and the input signal. An error amplifier is most commonly encountered in feedback voltage control circuits, where the sampled output voltage of the circuit under control is fed back and compared to a stable reference voltage. Any difference between the two generates a compensating error voltage.

A voltage reference is an electronic device that ideally produces a fixed (constant) voltage irrespective of the loading on the device, power supply variations, temperature changes, and the passage of time.

A reference voltage is a voltage value that is used as a target for a comparison operation.

When the term "the same" is used to describe two quantities, it means that the values of two quantities are determined the same within measurement limitations.

DETAILED DESCRIPTION

For a buck converter operating in continuous conduction mode, its duty-cycle can be expressed as shown in equation (1) below:

$$\text{Duty-Cycle}(D) = T_{on}/T = VOUT/VIN \qquad (1)$$

where Ton is the on-time of its high-side FET, and VOUT and VIN are the output and input voltages, respectively. When the Ton reaches its physical minimum on-time value, then the minimum duty cycle D_min becomes:

$$D\_min = T_{on\_min}/T = VOUT\_given/VIN\_max \qquad (2)$$

For a given fixed output voltage, VOUT_given, the corresponding VIN_max can only be pulled up to certain voltage level without breaking the VOUT-VIN relationship defined in equation (2). Applying any VIN voltage above the VIN_max value will create instability or abnormal behavior of the buck converter.

In order to extend the VIN operational range defined in equation (2), one way is to make the switching period (T) longer or the switching frequency slower. As the switching period increases, the corresponding VIN_max can be extended accordingly.

Similarly for a given fixed input voltage, VIN_given, the lower limit of VOUT_min can be redefined in the following D_min equation (3):

$$D\_min = T_{on\_min}/T = VOUT\_min/VIN\_given \qquad (3)$$

The VOUT_min can be reduced further if the switching period (T) can be made longer. Therefore, as shown in equation (2) and (3), the D_min can be smaller and the VIN (or VOUT) operational voltage range can be extended by making the switching period (T) longer for the buck converter.

In some embodiments, an "adaptive minimum duty cycle circuit" is used in the DCDC converter's controller to smoothly extend its minimum duty-cycle for a wider operational voltage range. For the existing products without the "adaptive minimum duty cycle design," the buck converter will show instability in switch node voltage, inductor current, or output voltage waveform when they are pushed beyond their D_min condition.

The "adaptive minimum duty cycle design" can smoothly and adaptively extend the switching period (T_adaptive) when the buck converter is reaching towards its minimum on-time (Ton_min) condition such that its effective duty cycle (Ton_min/T_adaptive) can be adaptively reduced until VIN (or VOUT) reaches its final target value.

The extended minimum duty cycle can satisfy the operational requirements specified in equations (1) to (3) listed above. Thus, there is no instability seen in inductor current or output voltage waveforms. The new adaptive controller design is able to extend the VIN (or VOUT) operational voltage range successfully without significant cost increase, complicated high-voltage or valley current detection, compromises of the system's EMI performance or the risk of non-recoverable damages.

Figure 1:
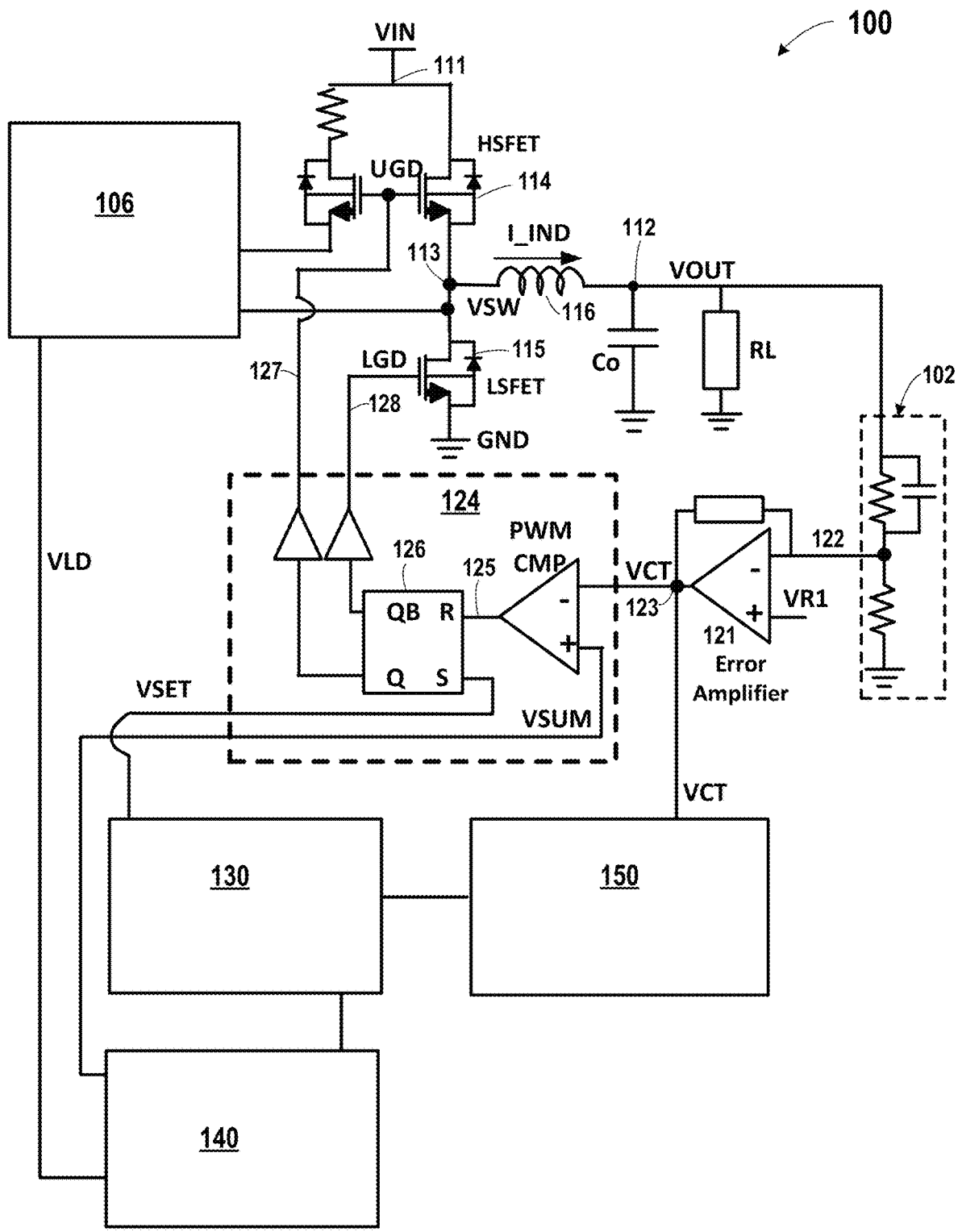
FIG. 1 is a simplified schematic/block diagram illustrating a switched mode power supply (SMPS) that embodies certain aspects of this invention.

FIG. 1 is a simplified schematic/block diagram illustrating a switched mode power supply (SMPS) that embodies certain aspects of this invention. As shown in FIG. 1, power converter 100 is an example of SMPS, which is configured as a buck converter. It is understood, however, that the embodiments described herein are applicable to other types of SMPS, such as boost converters and buck-boost converters, etc. In the example of FIG. 1, SMPS 100 includes an input node 111 for coupling to an input voltage VIN, an output node 112 for providing an output voltage VOUT, a first switch 114 coupled between the input node 111 and a switching node 113, a second switch 115 coupled between the switching node 113, and a ground node GND. SMPS 100 also includes an inductor 116 coupled between the switching node 113 and the output node 112 for providing an inductor current I_IND to the output node 112 under control of the first switch 114 and the second switch 115 in response to a first switching control signal 127 and a second switching control signal 128. FIG. 1 also shows an output capacitor Co and a resistor RL representing a load device for SMPS 100.

In FIG. 1, SMPS is in a half-bridge configuration. The first switch 114 is also referred to as the high-side transistor (HSFET), which is coupled to the second switch 115, which is also referred to as the low-side transistor (LSFET). The first switching control signal 127 is also referred to as an upper gate drive signal (UGD), and the second switching control signal 128 is also referred to as the lower gate drive signal (LGD).

SMPS 100 also includes a voltage sensing circuit 102, which includes a voltage divider and provides a sampled output voltage signal 122, and a current sense circuit 106, which is coupled to the first switch 114 through a sensed transistor and provides a sensed current voltage signal VLD.

SMPS 100 further includes a controller that includes an error amplifier 121, a PWM circuit 124, an oscillator circuit 130, a slope compensation circuit 140, and an adaptive minimum duty-cycle circuit 150. The error amplifier 121 is configured to compare a sampled output voltage 122 with a first reference voltage VR1 to provide an error voltage signal VCT at an output node 123 of the error amplifier 121. The oscillator circuit 130 is configured for providing a clock signal VSET. The slope compensation circuit 140 is configured for slope compensation and to provide a saw-tooth signal VSUM to the PWM circuit 124. The adaptive minimum duty-cycle circuit 150 is configured to receive the error voltage signal VCT and to generate a current signal to vary an oscillating frequency of the clock signal VSET in response to the error voltage signal VCT.

The pulse-width modulation (PWM) circuit 124 includes a comparator PWM CMP configured to compare the error voltage signal VCT and the saw-tooth signal VSUM and provide an output signal 125. The PWM circuit 124 also includes a latch 126 configured to receive the output signal 125 from comparator PWM CMP and a clock signal VSET from the oscillator circuit 130 and to provide the first and second switching control signals 127 and 128 to control the first switch 114 and the second switch 115 using PWM control.

Figure 2:
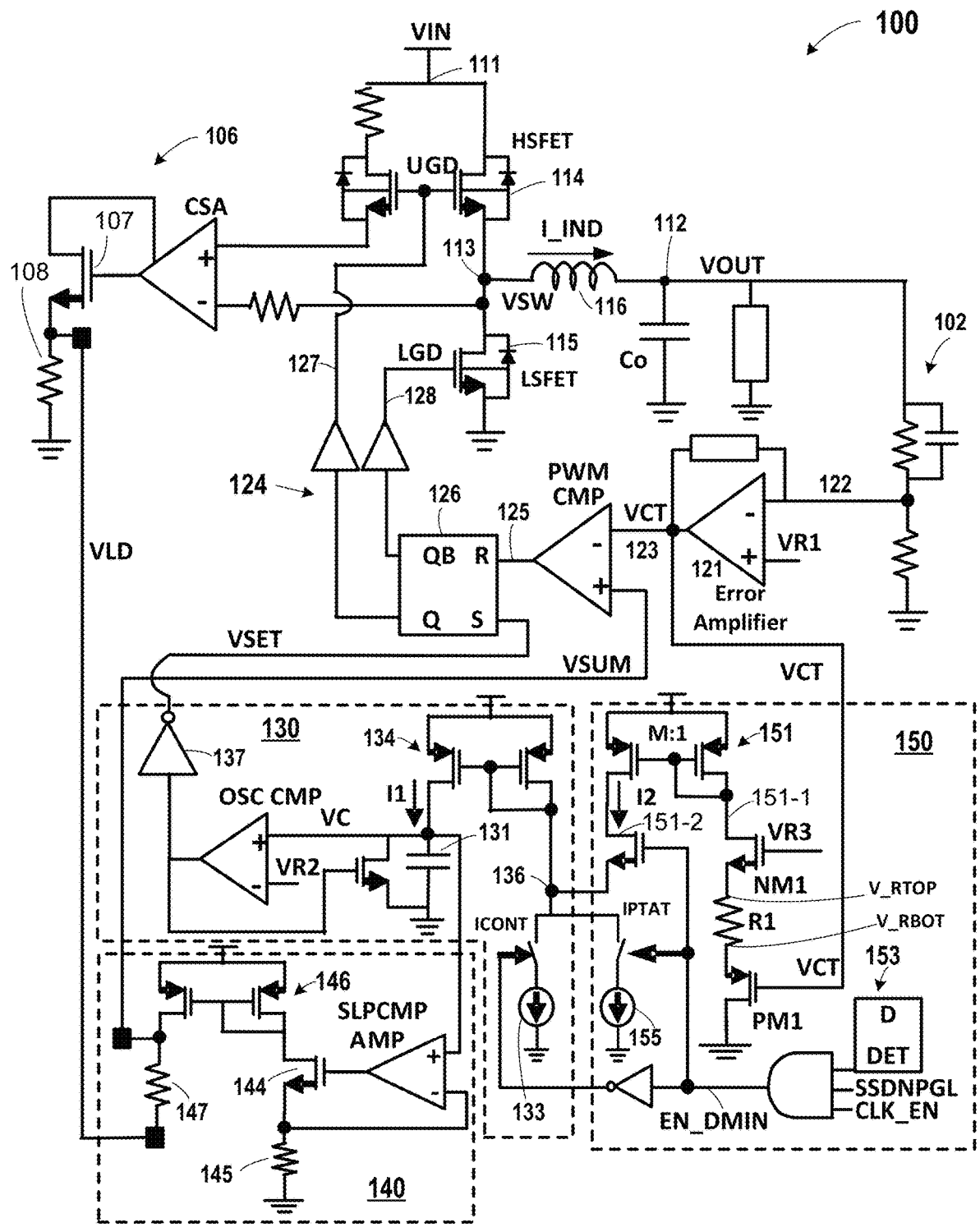
FIG. 2 is a simplified schematic diagram illustrating a switched mode power supply (SMPS) that embodies certain aspects of this invention.

FIG. 2 is a simplified schematic diagram illustrating a switched mode power supply (SMPS) that embodies certain aspects of this invention. Similar to FIG. 1, FIG. 2 illustrates the power converter 100 with example schematic implementations for oscillator circuit 130, slope compensation circuit 140, adaptive minimum duty-cycle circuit 150, and current sense circuit 106.

As shown in FIG. 2, the oscillator circuit 130 includes a capacitor 131, a first constant current source 133, a current mirror (134) coupled to the first constant current source 133 at a node 136 to provide a first current I1 for charging the capacitor 131, a comparator OSC CMP for comparing a capacitor voltage (VC) on capacitor 131 with a second reference voltage VR2 for discharging the capacitor 131, and an inverter (137) coupled to an output of the comparator to provide a clock signal (VSET).

As shown in FIG. 2, slope compensation circuit 140 includes an amplifier SLPCMP AMP having a positive input node coupled to the capacitor voltage (VC) in the oscillator circuit 130 and a negative input node coupled to a feedback circuit including a transistor 144 and a resistor 145. The slope compensation circuit 140 also includes a current mirror 146 having a first branch coupled to the amplifier SLPCMP AMP through transistor 144 and a second branch coupled to the voltage signal (VLD) from the current sense circuit 106 through a resistor 147. The slope compensation circuit 140 produces a saw-tooth signal VSUM to the PWM circuit (124).

Still with reference to FIG. 2, the adaptive minimum duty-cycle circuit 150 includes a first PMOS transistor (P-type metal-oxide-silicon transistor) PM1 with a gate node coupled to the error voltage signal VCT, a first NMOS transistor (N-type metal-oxide-silicon transistor) NM1 with a gate node coupled to a third reference voltage VR3, and a first resistor R1. Adaptive minimum duty-cycle circuit 150 also includes a current mirror 151 having a first branch 151-1 coupled to the first NMOS transistor NM1, the first resistor R1, and the first PMOS transistor PM1 connected in series, and a second branch 151-2 providing a second current I2 to the oscillator circuit 130.

The adaptive minimum duty-cycle circuit 150 further includes an adaptive minimum duty-cycle enabling circuit 153 configured to determine whether a minimum on-time condition is reached and, if so, to provide an adaptive minimum duty-cycle enabling signal EN_DMIN that causes the second current I2 to be coupled to the oscillator circuit 130 at node 136. In some embodiments, the adaptive minimum duty-cycle enabling circuit 153 is further configured to determine that the following conditions are met before providing the adaptive minimum duty-cycle enabling signal: soft-start completed, output voltage power good, and continuous conduction mode (CCM) or forced PWM mode. The detailed enabling sequence is described in later sections. As used herein, forced PWM mode refers to the control that eliminates discontinuous mode by allowing the reverse current from the inductor at light load. In some embodiments, the adaptive minimum duty-cycle circuit 150 also includes a second current source 155 (IPTAT). The adaptive minimum duty-cycle enabling signal EN_DMIN further causes the second current source 155 (IPTAT) to be coupled to the oscillator circuit 130 and causes the first constant current source 133 (ICONST) to be decoupled from the oscillator circuit. The IPTAT current is used to compensate for temperature variations caused by the resistance of R1 and the turn-on threshold voltages of NM1 and PM1.

Figure 3:
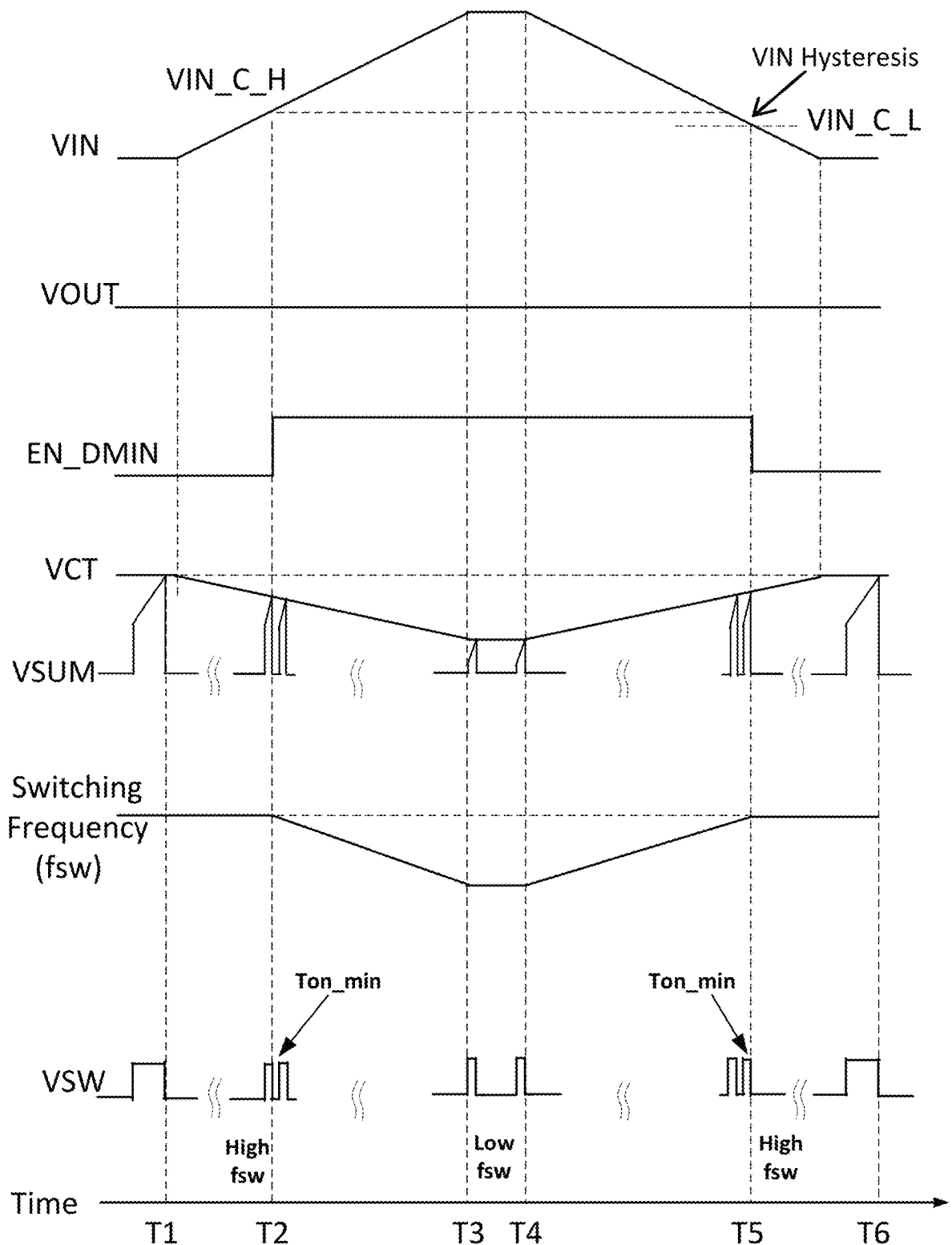
FIG. 3 shows simulated timing signal plots illustrating the operation of the SMPS 100 of FIGS. 1 and 2 that embodies certain aspects of this invention.

FIG. 3 shows simulated timing signal plots illustrating the operation of the SMPS 100 of FIGS. 1 and 2 that embodies certain aspects of this invention. In FIG. 3, the horizontal axes show the time, and vertical axes show signals for the following:

VIN—the input voltage of SMPS 100;
VOUT—the output voltage of SMPS 100;
EN_DMIN—the adaptive minimum duty-cycle enable signal;
VCT—the error voltage;
VSUM—the saw-tooth signal;
fsw—the switching frequency of the SMPS; and
VSW—the switching node voltage.

The operation of SMPS 100 is described below with reference to FIGS. 1, 2, and 3.

In FIGS. 1 and 2, an embodiment of SMPS 100 is configured as a DCDC buck converter with adaptive minimum duty-cycle (D_min) for extended operational voltage range. FIGS. 1 and 2 show the current-controlled oscillator 130, slope compensation block 140, and adaptive minimum duty-cycle control circuit 150.

As shown in FIG. 2, the buck converter has a peak-current-mode controller with current sensing and voltage regulation loops. The current sensing loop provides inductor current information with slope compensation to eliminate the complex-conjugated poles associated with the inductor and capacitor at the output, making the inductor as a current source for the ease of loop compensation and better stability. The oscillator's period is based on the time of charging and discharging a capacitor 131 with a controlled-current source. As the current value decreases, the charging time of the capacitor to a pre-set threshold voltage VR2 is increased, thus extending the period of the switching clock or folding down the switching frequency. The on-set of the extension of clock period is controlled by the sensing circuit (D_DET) for minimum duty cycle detection in an adaptive minimum duty-cycle enabling circuit 153. Once the clock period is adaptively adjusted, the slope compensation period is also changed accordingly to update the compensation over the adjusted clock period.

The adaptive minimum duty-cycle circuit 150 includes a circuit for detecting the minimum duty cycle condition of the buck converter. As shown in FIG. 2, it includes 1) a PMOSFET, PM1, for VCT voltage detection (the VCT is the output of the error amplifier); 2) an NMOSFET, NM1, with a reference voltage VR3 connected to its gate for controlling the current passing through the resistor, R1; and 3) current mirror 151 for steering current into the current source of the oscillator then adaptively adjusting the switching clock's period.

In some embodiments, the current steering is only allowed after soft-start, VOUT power good and the converter is operating in continuous conduction mode (CCM) or forced PWM mode. The CLK_EN signal is asserted high when the buck converter is in the two operation modes. If the DCDC buck converter is in pulse-frequency-modulation (PFM) mode, the oscillator is turned off, and the CLK_EN signal is pulled low, thus the adaptive minimum duty cycle circuit is turned off. In PFM mode, the VOUT voltage is regulated through a hysteretic mechanism by monitoring VOUT voltage and then replenishing charge to the output when VOUT voltage drops below a pre-set threshold voltage. Furthermore, the adaptive minimum duty-cycle circuit will not be turned on until a pre-set duty-cycle (D) is reached, e.g., D=8% corresponding to a Ton of 80 nS for switching frequency of 1 MHz. Before turning on the adaptive minimum duty-cycle circuit, the buck converter is operating at a fixed switching frequency. Once the adaptive circuit is turned on, the buck converter will operate at an adaptive switching frequency, spreading the energy of the fundamental tone, thus potentially reducing EMI issues.

As shown in FIGS. 1 and 2, the oscillator provides a switching clock signal (VSET) and a ramp voltage added with slope compensation to form a summed ramp (VSUM) for the PWM loop. The rising edge of the clock starts a PWM cycle by turning on the high-side FET (HSFET) which will stay on until the VSUM waveform intercepts with the output voltage (VCT) of the error amplifier, as shown by the VCT and VSUM curves in FIG. 3. Then the high-side FET (HSFET) is turned off and the low-side FET (LSFET) is turned on until the next PWM cycle. For a given fixed VOUT voltage, as VIN voltage increases, the on-time of the high-side FET reduces. The voltage control loop responds to the demand by lowering the output voltage (VCT) of the error amplifier. As the VCT voltage drops, it intercepts with the ramp waveform VSUM at an earlier time, resulting in a smaller duty-cycle. The minimum on-time (Ton_min) of the HSFET is set by the required logic delays, driver's timings and others as discussed earlier, limiting the minimum duty-cycle and operational voltage range.

As shown in FIG. 2, the adaptive minimum duty-cycle circuit 150 monitors the VCT continuously until it reaches the conditions specified in the following equations.

$$V\_RTOP = VR3 - Vthn \qquad (4)$$

$$V\_RBOT = VCT + Vthp \qquad (5)$$

For turning on the sensing circuit and current to flow $$V\_RTOP > V\_RBOT \qquad (6)$$

where V_RTOP and V_RBOT are the top and bottom voltages of R1, Vthn and Vthp are the turn-on threshold voltages of NM1 and PM1, respectively, and VCT is the error amplifier's output voltage.

When V_RTOP>V_RBOT, a current starts to flow in R1, and the current mirror will steer current (I2 current in the adaptive minimum duty-cycle circuit 150 of FIG. 2) into the controlled-current source 133 or 155 of the oscillator circuit 130, effectively reducing the current amount (I1) for charging the capacitor in the oscillator, which extends the period of the PWM clock signal. As a result, the minimum duty-cycle can be reduced to a smaller number than the fixed Ton_min. Therefore, the operational voltage range will be extended accordingly. Since the period of the PWM clock signal is increased linearly proportional to the amount of current flowing through R1, the clock period will also be changed smoothly and adaptively by the error voltage VCT.

In order to operate buck converters more efficiently and robustly with the adaptive minimum duty cycle circuit, there are several supplementary blocks to provide successful operation over process and temperature ranges. As shown in FIG. 2, the adaptive circuits will not be turned on until CCM operation is needed in order to save quiescent current in low power saving mode. As mentioned above, it is gated by the CLK_EN signal and is turned off in PFM operation. The adaptive circuit does not interfere with soft-start procedure; thus it is not turning on until the VOUT voltage reaches the power good condition. Moreover, the adaptive minimum duty cycle circuit is turned on only after the buck converter reaches a pre-set duty cycle. The circuit for duty-cycle detection compares 1) the average of VSW node voltage with 2) a reference voltage set by a pre-determined percentage of supply voltage for obtaining duty cycle information. Since the average of VSW node voltage is also proportional to the supply voltage (i.e. the average of VSW node voltage equals to D×VIN, D is duty-cycle, VIN is the supply voltage) the duty-cycle information obtained will maintain the same value over the variations of process, supply voltage, and temperature (PVT). In order words, the adaptive minimum duty cycle circuit will be turned on at the pre-set duty-cycle consistently over PVT corners.

Once the adaption of minimum duty-cycle starts, the deviation of the clock period is determined by the amount of the steering current, i.e. the I_STEERING in FIG. 2 drawn into the controlled current source of the oscillator. As shown in equation (7):

$$\text{I\_STEERING} = \frac{\text{V\_RTOP} - \text{V\_RBOT}}{R1} \times M \qquad (7)$$

where M is a fixed current mirror ratio, but the values of V_RTOP, V_RNOT, and R1 vary over PVT corners due to the variations of transistors' threshold voltages and resistor's resistance. Thus VR3 is trimmed over process corners. The current mirrors have good output impedance for constant output current over supply voltage variation, and an IPTAT current source is used to minimize the temperature coefficient of the steering current. The IPTAT current refers to a current proportional to absolute temperature current. As temperature increases, the IPTAT current increases. Since the threshold voltages of transistors NM1 and PM1 and the resistance of R1 all change with temperature, the 12 current will also change with temperature. The IPTAT current is used to compensate for the temperature variations when the adaptive minimum duty-cycle circuit is enabled.

With reference to FIG. 3, for a fixed VOUT voltage, as VIN increases, starting at time T1, the error amplifier's output voltage VCT is reduced; therefore, the duty cycle is reduced. When input voltage VIN increases to the threshold voltage, VIN_C_H, at time T2, the DCDC converter will reach Ton=Ton_min condition. Then the adaptive DMIN circuit is enabled and the EN_DMIN signal toggles high at time T2. The switching frequency (fsw) starts to decrease and its period (T) increases. Thus, its duty cycle will keep adaptively decreasing until VIN reaches its maximum value, at time T3. In the other direction, as VIN starts to reduce, at time T4, the fsw will increase until VIN drops to VIN_C_L=VIN_C_H−VIN_hysteresis, at time T5. Then the EN_DMIN signal toggles low to turn off the adaptive DMIN circuit and fsw returns to its normal frequency. The VIN_ hysteresis is used to prevent mode hopping.

In some embodiments, the Ton=Ton_min condition is determined by measuring the width of Ton and comparing it directly with the preset Ton_min threshold. Basically with a fixed switching period T, Ton is the on-time of HSFET when VSW node voltage is high. When HSFET is turn off and LSFET is turn on, then VSW node voltage becomes low. The average of the high-low VSW node voltage equals to D×VIN voltage, and D=VOUT/VIN=Ton/T. For example T=1 uS (fsw=1 MHz), a pre-set threshold Ton=Ton_min of 80 nS resulting in D=8%, if the average VSW node voltage becomes 8% of VIN voltage, then Ton=Ton_min. Thus the on-set of Ton_min condition can be determined by comparing the average VSW node voltage with a pre-set percentage of VIN voltage using a comparator. Thus, once Ton reaches the Ton_min threshold, the adaptive DMIN circuit is enabled and the EN_DMIN signal toggles high, starting the adaptive minimum duty cycle operation.

Figure 4:
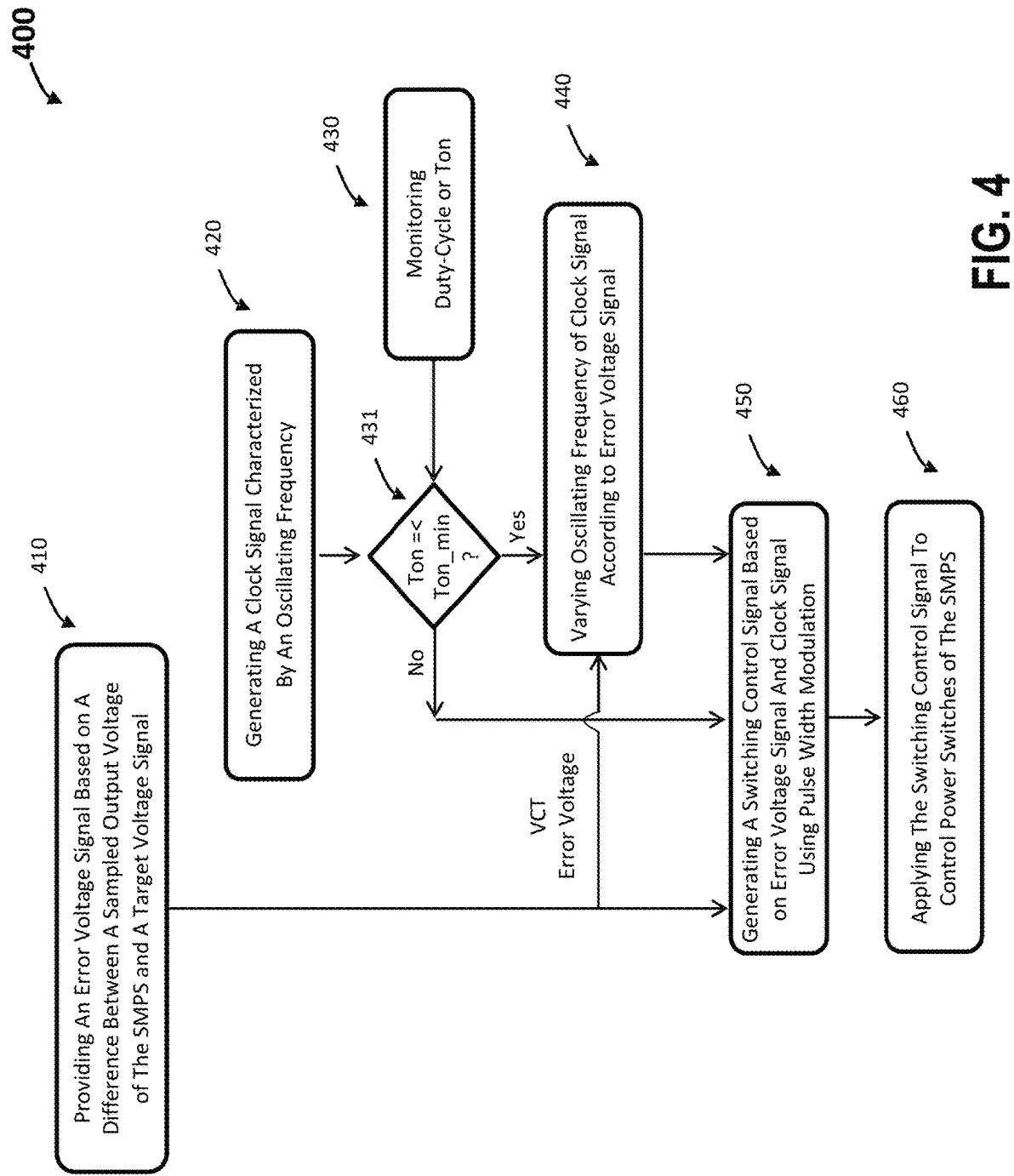
FIG. 4 is a simplified flowchart illustrating a method for a switched mode power supply (SMPS) that embodies certain aspects of this invention.

FIG. 4 is a simplified flowchart illustrating a method for a switched mode power supply (SMPS) that embodies certain aspects of this invention. As shown in FIG. 4, a method 400 for the operation of an SMPS can be briefly summarized as follows and further described below.

At 410, providing an error voltage signal based on a difference between a sampled output voltage of the SMPS and a target voltage signal;

At 420, generating a clock signal characterized by an oscillating frequency;

At 430, monitoring duty-cycle or on-time Ton;

At 431, determining whether Ton is equal to or less than Ton_min;

if "yes", go to step 440 otherwise go to step 450 directly;

At 440, varying the oscillating frequency of the clock signal according to the error voltage signal;

At 450, generating a switching control signal based on the error voltage signal and the clock signal using pulse-width modulation;

At 460, applying the switching control signal to control the power switches of the SMPS.

At 410, the method 400 includes providing an error voltage signal (VCT) based on a difference between a sampled output voltage of the SMPS and a target voltage signal. In some embodiments, such as shown in FIG. 2, the error amplifier 121 is configured to compare a sampled output voltage 122 with a first reference voltage VR1 to provide an error voltage signal VCT at an output node 123 of the error amplifier 121.

At 420, the method 400 includes generating a clock signal characterized by an oscillating frequency. In some embodiments, such as shown in FIG. 2, generating a clock signal includes using a first current from a first constant current source (133) to charge a capacitor (131), and using a comparator (OSC CMP) for comparing a voltage (VC) on the capacitor with a second reference voltage (VR2) to determine a condition for discharging the capacitor.

At 430, the method includes monitoring duty-cycle D or on-time Ton. In some embodiments, such as shown in FIG. 2, the average VSW voltage (113) is compared with a pre-set percentage (e.g. 8%) of the input voltage VIN (111), forming the D_DET circuit (153). The average of the high-low switching VSW node voltage equals to D×VIN voltage and D=VOUT/VIN=Ton/T. For example, if T=1 uS (fsw=1 MHz), a pre-set threshold Ton=Ton_min of 80 nS results in D=8%, if the average VSW node voltage becomes 8% of VIN voltage, then Ton=Ton_min.

At 431, the method includes using a comparator with a first input coupled from a pre-set percentage of the input voltage and a second input coupled from the average VSW node voltage. If the average VSW node voltage is equal to or less than the pre-set percentage of the input voltage, then the comparator outputs a high signal, indicating the Ton=<Ton_min condition is reached and enabling the adaptive DMIN circuit to send the clock signal with slow down switching frequency to the following step 440. Otherwise the oscillator clock signal with normal switching frequency is sent to the following step 450 directly.

At 440, the method includes varying the oscillating frequency of the clock signal according to the error voltage signal. Here, varying the oscillating frequency includes generating a second current according to the error voltage signal, and using the second current to vary a charging current of the capacitor. The method also includes using an adaptive minimum duty-cycle circuit 150 that includes a first PMOS transistor (P-type metal-oxide-silicon transistor) PM1 with a gate node coupled to the error voltage signal VCT, a first NMOS transistor (N-type metal-oxide-silicon transistor) NM1 with a gate node coupled to a third reference voltage VR3, and a first resistor R1. Adaptive minimum duty-cycle circuit 150 also includes a current mirror 151 having a first branch 151-1 coupled to the first NMOS transistor NM1, the first resistor R1, and the first PMOS transistor PM1 connected in series, and a second branch 151-2 providing a second current I2 to the oscillator circuit 130. As shown at 431, the method includes determining whether a minimum on-time condition is reached and, if so, providing an adaptive minimum duty-cycle enabling signal that causes the second current to be coupled to the oscillator circuit.

At 450, the method includes generating a switching control signal based on the error voltage signal and the clock signal using pulse-width modulation. In the example of FIGS. 1 and 2, the pulse-width modulation (PWM) circuit 124 includes a comparator PWM CMP configured to compare the error voltage signal VCT and the saw-tooth signal VSUM then provide an output signal 125. The PWM circuit 124 also includes a latch 126 configured to receive the output signal 125 from comparator PWM CMP and a clock signal VSET from the oscillator circuit 130 and to provide the first and second switching control signals 127 and 128 to control the first switch 114 and the second switch 115 using PWM control.

At 460, the method includes applying the switching control signal to control the power switches of the SMPS. In the example of FIGS. 1 and 2, PWM circuit 124 is configured to receive the output signal 125 from comparator PWM CMP and a clock signal VSET from the oscillator circuit 130 and to provide the first and second switching control signals 127 and 128 to control the first switch 114 and the second switch 115 using PWM control.

In some embodiments, determining whether a minimum on-time condition is reached includes comparing the divided input voltage with a threshold voltage. In alternative embodiments, determining whether a minimum on-time condition is reached comprises comparing a measured on-time (Ton) with a preset minimum on-time (Ton_min).

Figure 5:
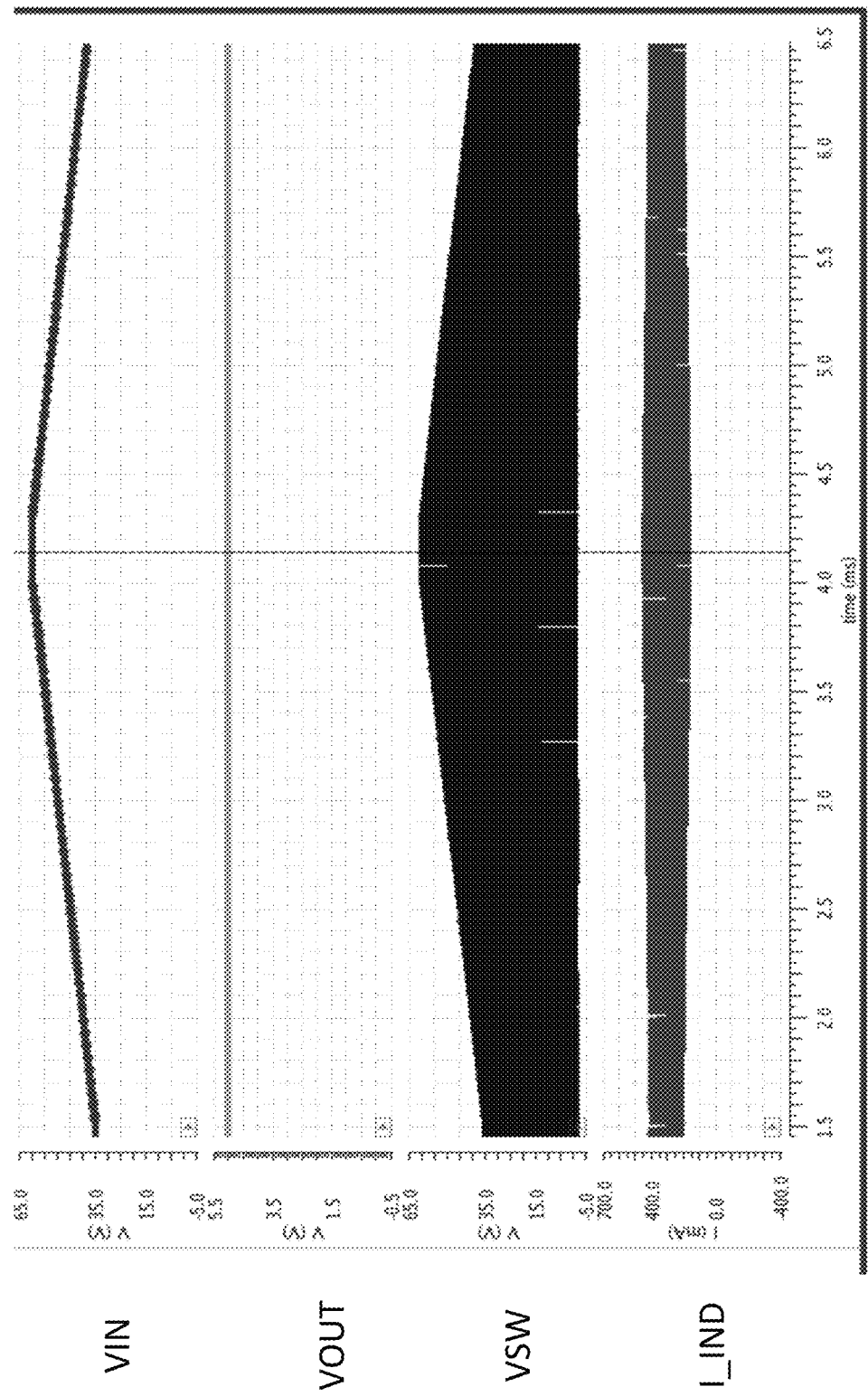
FIG. 5 shows simulated waveforms illustrating the operation of a buck converter that includes the adaptive minimum duty-cycle.
Figure 6:
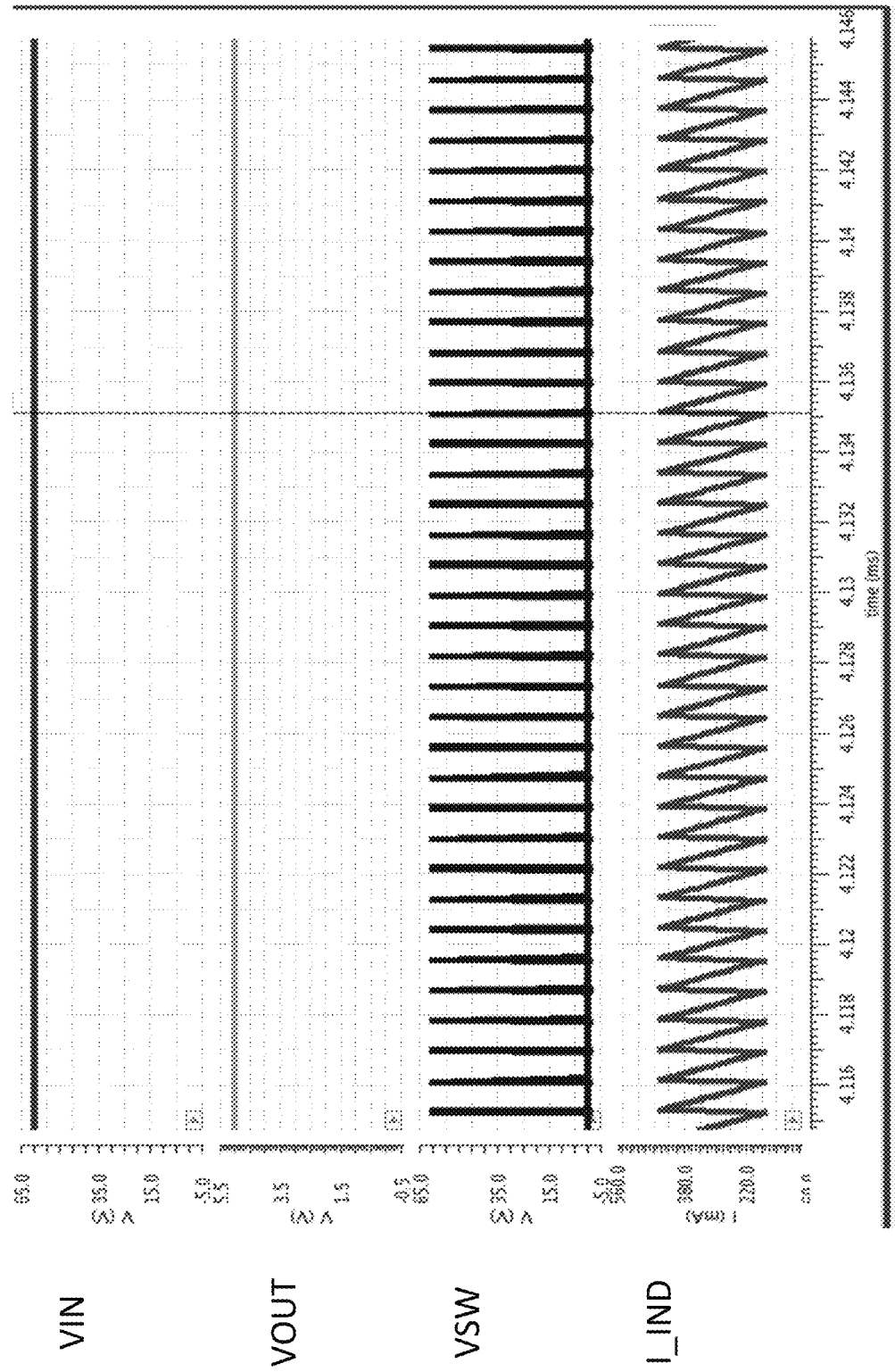
FIG. 6 shows a magnified view of a portion of the waveforms of FIG. 5 that embodies certain aspects of this invention.

FIG. 5 shows simulated waveforms illustrating the operation of a buck converter that includes the adaptive minimum duty-cycle that embodies certain aspects of this invention. FIG. 6 shows a magnified view of a portion of the waveforms of FIG. 5. FIG. 5 shows simulation results for a DCDC buck converter with the adaptive minimum duty-cycle design for extended VIN up to 60V for a given fixed VOUT=5V. FIG. 6 shows zoom-in plots of FIG. 5 showing clean waveforms for switch node voltage and inductor current for VIN=60V and VOUT=5V.

In FIGS. 5 and 6, the horizontal axes show the time, and the vertical axes show simulated waveforms for the input voltage VIN, the output voltage VOUT, the voltage at the switching node 113 VSW, and the current in inductor 116 I_IND. FIG. 5 shows clean waveforms of switch node voltage VSW and inductor current I_IND for the converter with the adaptive minimum duty cycle circuit in effect, operating VIN all the way up to 60V. As shown in the zoom-in plots of FIG. 6 in the center portion of FIG. 5 around VIN=60V, the DCDC buck converter is able to regulate normally with clean cycle-by-cycle inductor current waveforms I_IND and continuous switch node voltage waveform VSW for a given fixed VOUT of 5V.

Figure 7:
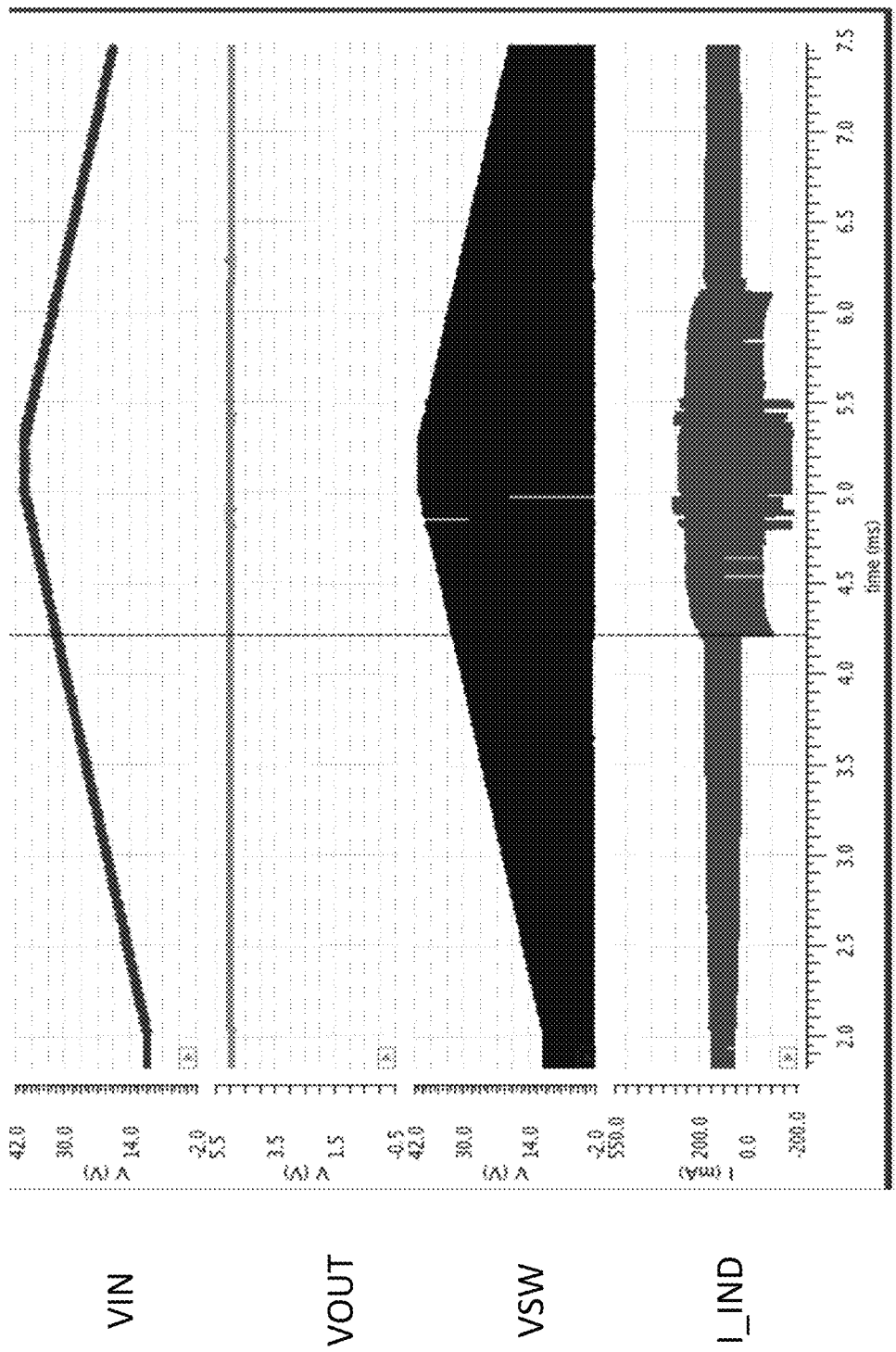
FIG. 7 shows simulated waveforms illustrating the operation of a buck converter without the adaptive minimum duty-cycle described above that embodies certain aspects of this invention.
Figure 8:
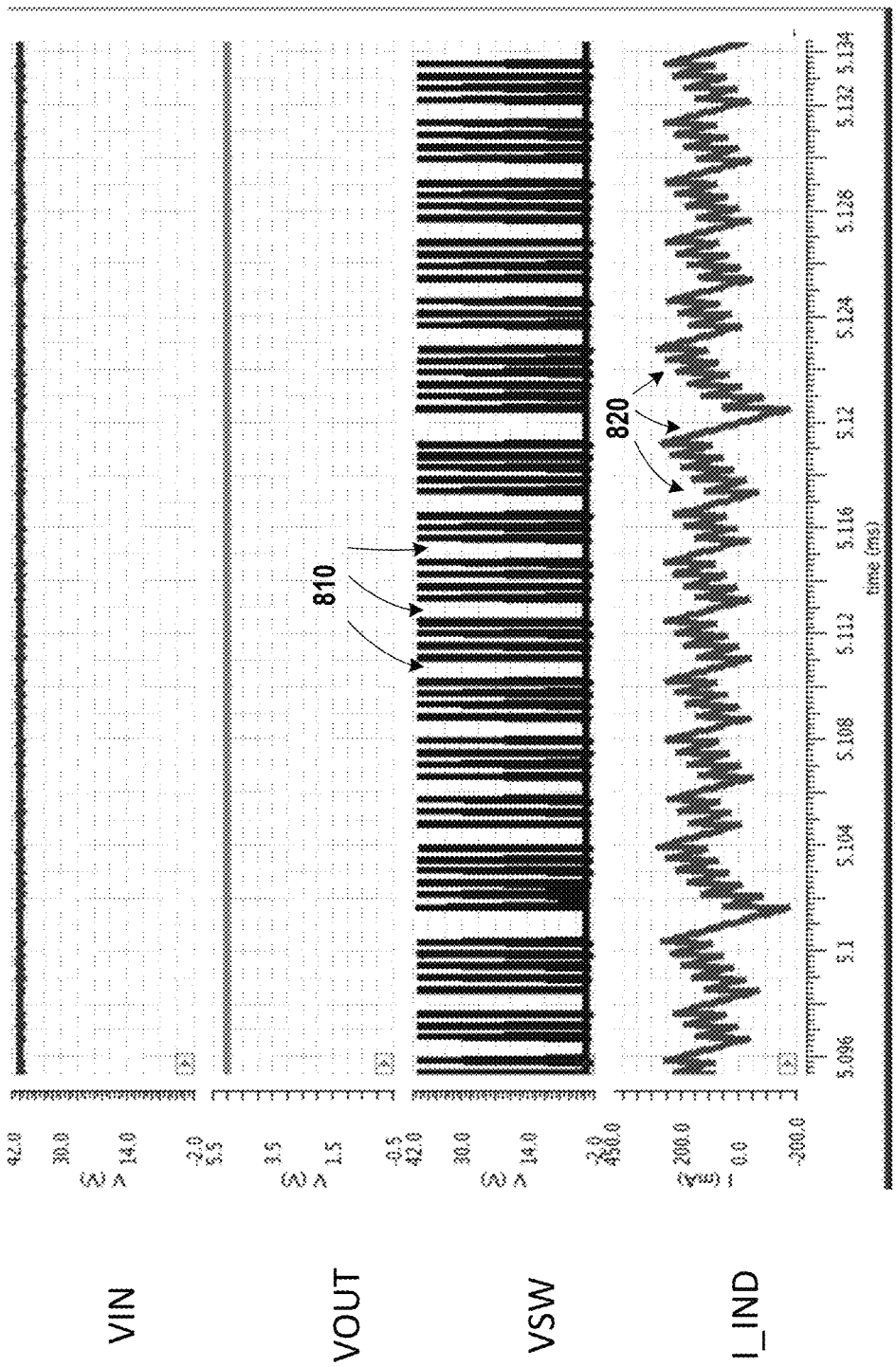
FIG. 8 shows a magnified view of a portion of the waveforms of FIG. 7 that embodies certain aspects of this invention.

FIG. 7 shows simulated waveforms illustrating the operation of a buck converter without the adaptive minimum duty-cycle described above, and FIG. 8 shows a magnified view of a portion of the waveforms of FIG. 7. FIG. 7 shows simulation results for a DCDC buck converter without the adaptive minimum duty-cycle design, and VIN only extends up to 31.5V for a given fixed VOUT=5V. FIG. 8 shows zoom-in plots of FIG. 7, showing skip pulses in switch node waveform and instability of inductor current for VIN starting around 31.5V and VOUT=5V.

In FIGS. 7 and 8, the horizontal axes show the time, and the vertical axes show simulated waveforms for the input voltage VIN, the output voltage VOUT, the voltage at the switching node 113 VSW, and the current in inductor 116 I_IND. As shown in FIGS. 7 and 8, without the adaptive minimum duty-cycle circuit, the DCDC buck converter shows abnormal line regulation starting from around VIN=31.5V for a given fixed VOUT of 5V. As shown in the zoom-in plots of FIG. 8 with abnormal line regulation, the switch node waveform VSW starts to show skip pulses 810, and the inductor current waveform I_IND also shows sub-harmonic oscillations 820. When the condition "D_min= Ton_min/T" is met, Ton has reached its physical minimum value (Ton_min) and the switching period T is fixed. Any attempt to reduce D_min further will cause pulse skipping in the switch node (VSW) and irregular waveforms in inductor current (I_IND). Pulse skipping occurs in the switch node waveforms; thus, VOUT voltage will show irregular voltage ripples. When the irregular VOUT voltage is too low, the converter will try to supply more inductor current to raise VOUT voltage for several cycles, corresponding to the up-slope of inductor current waveforms I_IND. However due to the irregular waveforms, VOUT can be over-corrected too high; then the converter will pull charge out of VOUT node, corresponding to the down-slope of inductor current waveforms I_IND. These irregularities become worse as VIN is pulled to even higher voltages.

Embodiments described above provide a cost effective solution to extend the minimum duty-cycle for DCDC converters with wider operational voltage range. It does not require extra mask layers or re-design of complicated high-voltage amplifiers. As shown in the simulation results, the DCDC converter with the adaptive minimum duty-cycle circuit shows extended operation range and stable waveforms in output voltage, switch node and inductor current without pulse skipping or sub-harmonic oscillation. The adaptive method can also be applied to all types of DCDC converters, and not just limited to buck converters, for example, the controllers of boost and buck-boost converters.

While the subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the disclosure has been presented for purposes of example rather than limitation, and does not preclude inclusion of such modifications, variations, and/or additions to the subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switched mode power supply (SMPS), comprising:
   an input node for coupling to an input voltage;
   an output node for providing an output voltage;
   a first switch coupled between the input node and a switching node;
   a second switch coupled between the switching node and ground node;
   an inductor coupled between the switching node and the output node for providing an inductor current to the output node under control of the first and second switches in response to a switching control signal;
   an error amplifier configured to compare a sampled output voltage with a first reference voltage to provide an error voltage signal;
   an oscillator circuit for providing a clock signal, wherein the oscillator circuit comprises:
      a capacitor;
      a first constant current source;
      a current mirror coupled to the first constant current source to provide a first current for charging the capacitor;
      a comparator for comparing a voltage on the capacitor with a second reference voltage for discharging the capacitor; and
      an inverter coupled to an output of the comparator to provide the clock signal;
   an adaptive minimum duty-cycle circuit configured to receive the error voltage signal and to generate a current signal to vary an oscillating frequency of the clock signal in response to the error voltage signal; and
   a pulse-width modulation (PWM) circuit configured to receive the error voltage signal and the clock signal and to provide the switching control signal to control the first and second switches.

2. The switched mode power supply of claim 1, wherein the adaptive minimum duty-cycle circuit comprises:
   a first PMOS transistor (P-type metal-oxide-silicon transistor) with a gate node coupled to the error voltage signal;
   a first NMOS transistor (N-type metal-oxide-silicon transistor) with a gate node coupled to a third reference voltage;
   a first resistor; and
   a second current mirror having:
      a first branch coupled to the first NMOS transistor, the first resistor, and the first PMOS transistor connected in series; and
      a second branch providing a second current to the oscillator circuit.

3. The switched mode power supply of claim 2, wherein the adaptive minimum duty-cycle circuit further comprises an adaptive minimum duty-cycle enabling circuit configured to determine whether a minimum on-time condition is reached and, if so, provides an adaptive minimum duty-cycle enabling signal that causes the second current to be coupled to the oscillator circuit.

4. The switched mode power supply of claim 3, wherein the adaptive minimum duty-cycle enabling circuit is further configured to determine that following conditions are met before providing the adaptive minimum duty-cycle enabling signal:
   soft-start completed;
   output voltage power good; and
   continuous conduction mode (CCM) or forced PWM mode.

5. The switched mode power supply of claim 4, wherein the adaptive minimum duty-cycle circuit further comprises a second current source (IPTAT); and
   wherein the adaptive minimum duty-cycle enabling signal further causes the second current source (IPTAT) to be coupled to the oscillator circuit and causes the first constant current source to be decoupled from the oscillator circuit.

6. The switched mode power supply of claim 4, wherein the PWM circuit comprises:
   a second comparator configured to compare the error voltage signal and a saw-tooth signal and provide an output signal;
   a latch configured to receive the output signal from the second comparator and provide the switching control signal using pulse-width modulation (PWM) to control the first and second switches; and
   a current sense circuit including an amplifier, a transistor, and a resistor, the current sense circuit being configured to provide a signal.

7. The switched mode power supply of claim 1, wherein the switched mode power supply is configured as a buck converter.

8. A controller for a switched mode power supply (SMPS), comprising:
   an error amplifier configured to compare a sampled output voltage of the SMPS with a first reference voltage to generate an error voltage signal;
   an oscillator circuit configured to provide a clock signal, wherein the oscillator circuit comprises:
      a capacitor;
      a first constant current source;
      a current mirror coupled to the first constant current source to provide a first current for charging the capacitor;
      a comparator for comparing a voltage on the capacitor with a second reference voltage for discharging the capacitor; and
      an inverter coupled to an output of the comparator to provide the clock signal;
   an adaptive minimum duty-cycle circuit configured to receive the error voltage signal and to generate a current signal to vary an oscillating frequency of the clock signal in response to the error voltage signal; and
   a PWM switching control circuit configured to receive the error voltage signal and the clock signal and to provide a PWM switching control signal for controlling a first power switch and a second power switch of the SMPS.

9. The controller of claim 8, wherein the adaptive minimum duty-cycle circuit comprises:
   a first PMOS transistor (P-type metal-oxide-silicon transistor) with a gate node coupled to the error voltage signal;
   a first NMOS transistor (N-type metal-oxide-silicon transistor) with a gate node coupled to a third reference voltage;
   a first resistor; and
   a second current mirror having:
      a first branch coupled to the first NMOS transistor, the first resistor, and the first PMOS transistor connected in series; and
      a second branch providing a second current to the oscillator circuit.

10. The controller of claim 9, wherein the adaptive minimum duty-cycle circuit further comprises an adaptive minimum duty-cycle enabling circuit configured to determine whether a minimum on-time condition is reached and, if so, provide an adaptive minimum duty-cycle enabling signal that causes the second current to be coupled to the oscillator circuit.

11. The controller of claim 10, wherein the adaptive minimum duty-cycle circuit further comprises a second current source (IPTAT); and
wherein the adaptive minimum duty-cycle enabling signal further causes the second current source (IPTAT) to be coupled to the oscillator circuit and causes the first constant current source to be decoupled from the oscillator circuit.

12. A method for a switched mode power supply (SMPS), comprising:
providing an error voltage signal based on a difference between a sampled output voltage of the SMPS and a target voltage;
generating a clock signal characterized by an oscillating frequency, wherein generating the clock signal comprises:
using a first current from a first constant current source to charge a capacitor; and
using a comparator for comparing a voltage on the capacitor with a second reference voltage to determine a condition for discharging the capacitor;
generating a switching control signal based on the error voltage signal and the clock signal using pulse-width modulation (PWM);
varying the oscillating frequency of the clock signal according to the error voltage signal; and
applying the switching control signal to control a first power switch and a second power switch of the SMPS.

13. The method of claim 12, wherein varying the oscillating frequency comprises:
generating a second current using the error voltage signal as an input; and
using the second current to vary a charging current of the capacitor.

14. The method of claim 13, further comprising using an adaptive minimum duty-cycle circuit that includes:
a first PMOS transistor (P-type metal-oxide-silicon transistor) with a gate node coupled to the error voltage signal;
a first NMOS transistor (N-type metal-oxide-silicon transistor) with a gate node coupled to a third reference voltage;
a first resistor; and
a current mirror having:
a first branch coupled to the first NMOS transistor, the first resistor, and the first PMOS transistor connected in series; and
a second branch providing a second current to an oscillator circuit.

15. The method of claim 14, further comprising determining whether a minimum on-time condition is reached and, if so, providing an adaptive minimum duty-cycle enabling signal that causes the second current to be coupled to the oscillator circuit.

16. The method of claim 15, where determining whether the minimum on-time condition is reached comprises comparing a divided input voltage with a threshold voltage.

17. The method of claim 15, where determining whether the minimum on-time condition is reached comprises comparing a measured on-time with a preset minimum on-time.

* * * * *